US008872292B2

(12) United States Patent
Deak et al.

(10) Patent No.: US 8,872,292 B2
(45) Date of Patent: Oct. 28, 2014

(54) PUSH-PULL MAGNETORESISTIVE SENSOR BRIDGES AND MASS FABRICATION METHOD

(76) Inventors: James Geza Deak, Zhangjiagang (CN); Insik Jin, Zhangjiagang (CN); Weifeng Shen, Zhangjiagang (CN); Songsheng Xue, Zhangjiagang (CN); Xiaofeng Lei, Zhangjiagang (CN); Xiaojun Zhang, Zhangjiagang (CN); Dongfeng Li, Zhangjiagang (CN)

(*) Notice: Subject to any disclaimer, the term of this patent is extended or adjusted under 35 U.S.C. 154(b) by 0 days.

(21) Appl. No.: 14/002,733

(22) PCT Filed: Mar. 2, 2012

(86) PCT No.: PCT/CN2012/071854
§ 371 (c)(1),
(2), (4) Date: Sep. 2, 2013

(87) PCT Pub. No.: WO2012/116657
PCT Pub. Date: Sep. 7, 2012

(65) Prior Publication Data
US 2014/0203384 A1    Jul. 24, 2014

(30) Foreign Application Priority Data
Mar. 3, 2011  (CN) .......................... 2011 1 0050705

(51) Int. Cl.
*H01L 27/22* (2006.01)
*H01L 25/04* (2014.01)
*G01R 33/09* (2006.01)
*H01L 43/02* (2006.01)

(52) U.S. Cl.
CPC .............. *H01L 25/04* (2013.01); *G01R 33/093* (2013.01); *H01L 43/02* (2013.01); *G01R 33/098* (2013.01)
USPC .................................. 257/427; 257/E27.006

(58) Field of Classification Search
CPC . H01L 25/04; H01L 21/67709; H01L 27/222; H01L 27/224; H01L 29/82; H01L 2224/75733; G01K 7/00
USPC ......................................... 257/427, E27.006
See application file for complete search history.

(56) References Cited

U.S. PATENT DOCUMENTS 7,960,970 B2 *   6/2011  Kasajima et al. ............. 324/252
2011/0025321 A1 *  2/2011  Yamazaki et al. ............ 324/252

* cited by examiner

*Primary Examiner* — Elias M Ullah
(74) *Attorney, Agent, or Firm* — Yuqin Jin

(57) ABSTRACT

A multi-chip push-pull magnetoresistive bridge sensor utilizing magnetic tunnel junctions is disclosed. The magnetoresistive bridge sensor is composed of a two or more magnetic tunnel junction sensor chips placed in a semiconductor package. For each sensing axis parallel to the surface of the semiconductor package, the sensor chips are aligned with their reference directions in opposition to each other. The sensor chips are then interconnected as a push-pull half-bridge or Wheatstone bridge using wire bonding. The chips are wire-bonded to any of various standard semiconductor lead frames and packaged in inexpensive standard semiconductor packages.

13 Claims, 13 Drawing Sheets

PUSH-PULL MAGNETORESISTIVE SENSOR BRIDGES AND MASS FABRICATION METHOD

CROSS-REFERENCE TO A RELATED APPLICATION

This application is a 35 U.S.C. §371 national phase application of PCT/CN2012/071854, filed on Mar. 2, 2012, which claims priority to a Chinese Patent Application No. 201110050705, filed on Mar. 3, 2011, incorporated herein by reference in its entirety.

FIELD OF THE INVENTION

The invention relates to the general field of magnetic field detection by MTJ or GMR devices with particular reference to methods for integrating magnetic sensors into push-pull bridges using standard semiconductor packaging techniques.

BACKGROUND ART

Magnetic sensors are widely used in modern systems to measure or detect physical parameters including but not limited to magnetic field strength, current, position, motion, orientation, and so forth. There are many different types of sensors in the prior art for measuring magnetic field and other parameters. However, they all suffer from various limitations well known in the art, for example, excessive size, inadequate sensitivity and/or dynamic range, cost, reliability and other factors. Accordingly a need exists for improved magnetic sensors, especially sensors that can be easily integrated with semiconductor devices and integrated circuits and manufacturing methods thereof.

Magnetic tunnel junction (MTJ) sensors have the advantages of high sensitivity, small size, low cost, and low power consumption. Although MTJ devices are compatible with standard semiconductor fabrication processes, methods for building high sensitivity devices with sufficient yield for low cost mass production have not been adequately developed. In particular, yield issues due to offset in the magnetoresistive response of MTJ sensors, and difficulty in matching the magnetoresistive response of MTJ elements when combined to form bridge sensors have proven difficult.

SUMMARY OF THE INVENTION

In order to overcome the above-mentioned problems in the prior art, the present invention describes a magneto-resistive sensor using MTJ or GMR sensors in a multi-chip configuration to form push-pull bridge sensors.

A first possible implementation of the present invention is a push-pull half-bridge magnetic field sensor. The sensor includes one or more pairs of MTJ or GMR magnetoresistive sensor chips, wherein one of the sensor chips in each pair is rotated 180 degrees with respect to the other, and the sensor chips are adhered to a standard semiconductor package lead frame. Each sensor chip contains one or more MTJ or GMR sensor elements interconnected as a single magnetoresistive element or a plurality of MTJ or GMR magnetoresistive elements. The MTJ or GMR elements have a resistance that is linearly proportional to an applied magnetic field over some portion of their magnetoresistive transfer curve. Each of the magnetoresistive sensor chips have substantially the same $R_H$ and $R_L$ values. Note here and other places in this article the terms "substantially equal" or "of roughly equal size", refers to the difference is very small, generally within 5%. The bond pads of the sensor chip are designed such that more than one wire bond may be attached to each side of the string of magnetoresistive elements.

The sensor chips are designed such that the intrinsic saturation field of each magnetoresistive sensor chip minus the offset field of the sensor chip's transfer curve is greater than the desired maximum magnetic field the sensor bridge is intended to measure.

Furthermore, sensor chips are tested and sorted before assembly in order to better match their transfer curve characteristics.

Moreover, the two half bridges maybe are oriented at 90 degrees with respect to each other in order to produce a two-axis magnetic field sensor.

Finally, the lead frame and sensor chips are encapsulated in plastic to form a standard semiconductor package.

Another possible implementation of the present invention is a full bridge push-pull magnetic field sensor, comprised of one or more pairs of identical MTJ or GMR magnetoresistive sensor chips, wherein one of the sensor chips in each pair is rotated 180 degrees with respect to the other, and the sensor chips are adhered to a standard semiconductor package lead frame. Each sensor chip is configured as a pair of magnetoresistive elements, and each of the magnetoresistive elements in the pair is composed of a string of one or more GMR or MTJ magnetoresistive sensor elements. The MTJ or GMR elements have a resistance that is linearly proportional to an applied magnetic field over some portion of their magnetoresistive transfer curve. Each of the magnetoresistive sensor chips have substantially the same $R_H$ and $R_L$ values. The bond pads of each sensor chip are designed such that more than one wire bond may be attached to each side of each string of magnetoresistive elements. Each magnetoresistive sensor chip has a crossover in the top and bottom conductors, such that the bond pads on one side of the sensor chip are swapped in position with respect to the magnetoresistive elements, in order to permit wirebonding of the two identical chips in order to form a push-pull full-bridge sensor without crossing the bond wires. The input and output connections of the bridge composed of the magnetoresistive sensor chips are wire bonded to the lead frame.

Furthermore, the sensor chips are designed such that the intrinsic saturation field of each magnetoresistive sensor chip minus the offset field of the sensor chip's transfer curve is greater than the desired maximum magnetic field the sensor bridge is intended to measure. The sensor chips may be tested and sorted before assembly in order to better match their transfer curve characteristics. Finally, the lead frame and sensor chips are encapsulated in plastic to form a standard semiconductor package.

A two-axis version of the second implementation may be fabricated within a single package sensor wherein two full bridges as described in claim 6 are oriented at 90 degrees with respect to each other. Compared with the prior art, the present invention has the following advantages; it provides a push-pull bridge easily manufactured in a standard semiconductor package, comprising at least one pair of MTJ sensor chip, wherein a chip relative to the other chip is rotated 180 degrees. In this arrangement, the non-ideal offset in magnetoresistive response that occurs during manufacturing of the sensors cancels, thus providing linear sensor with nearly ideal response.

DETAILED DESCRIPTION

The combination of the preferred embodiments of the invention are described in detail, in order to make the advantages and features of the invention more clear to those skilled in the art and also to define the scope of protection of the invention.

Figure 1:
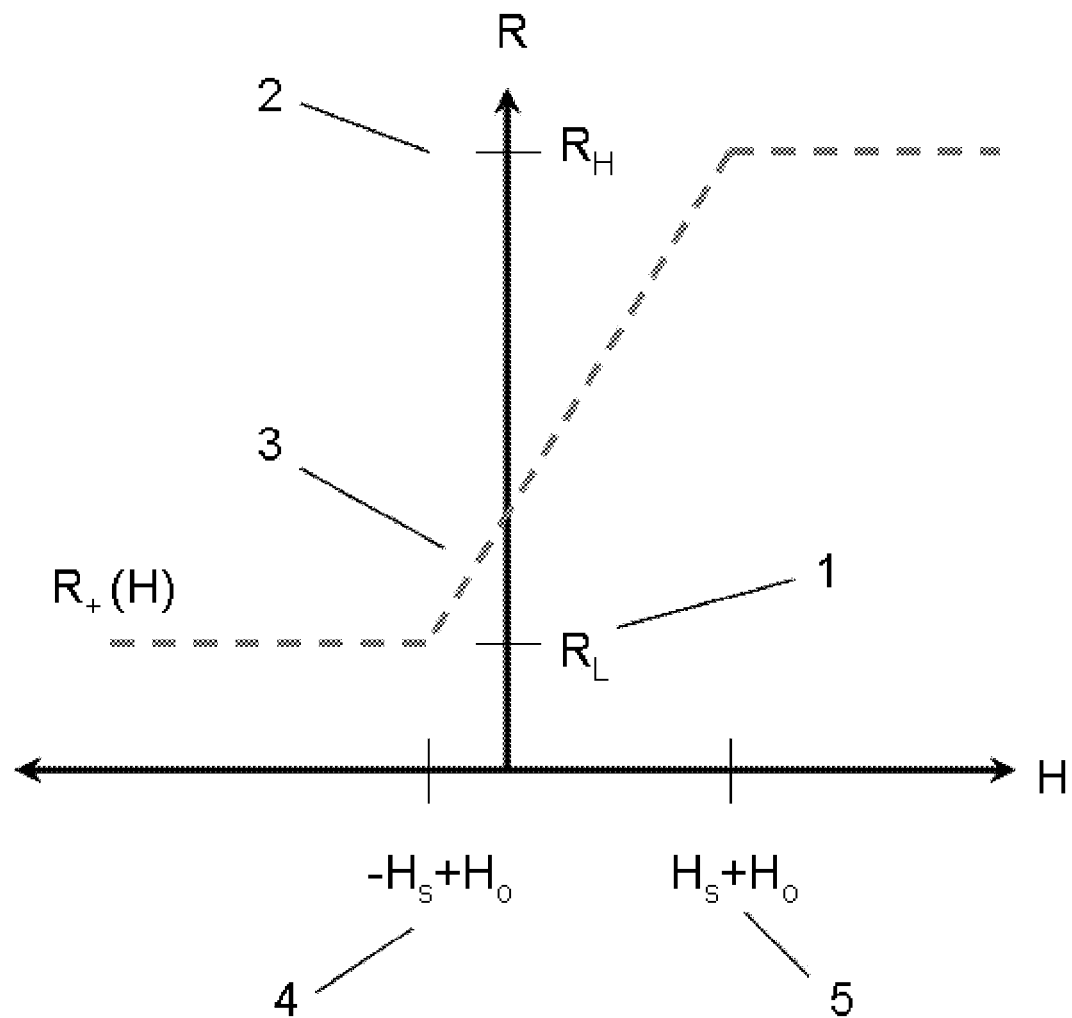
FIG. 1—Schematic drawing of the magnetoresistive response of a spin-valve sensing element with the reference layer magnetization pointing in the negative H direction.
Figure 2:
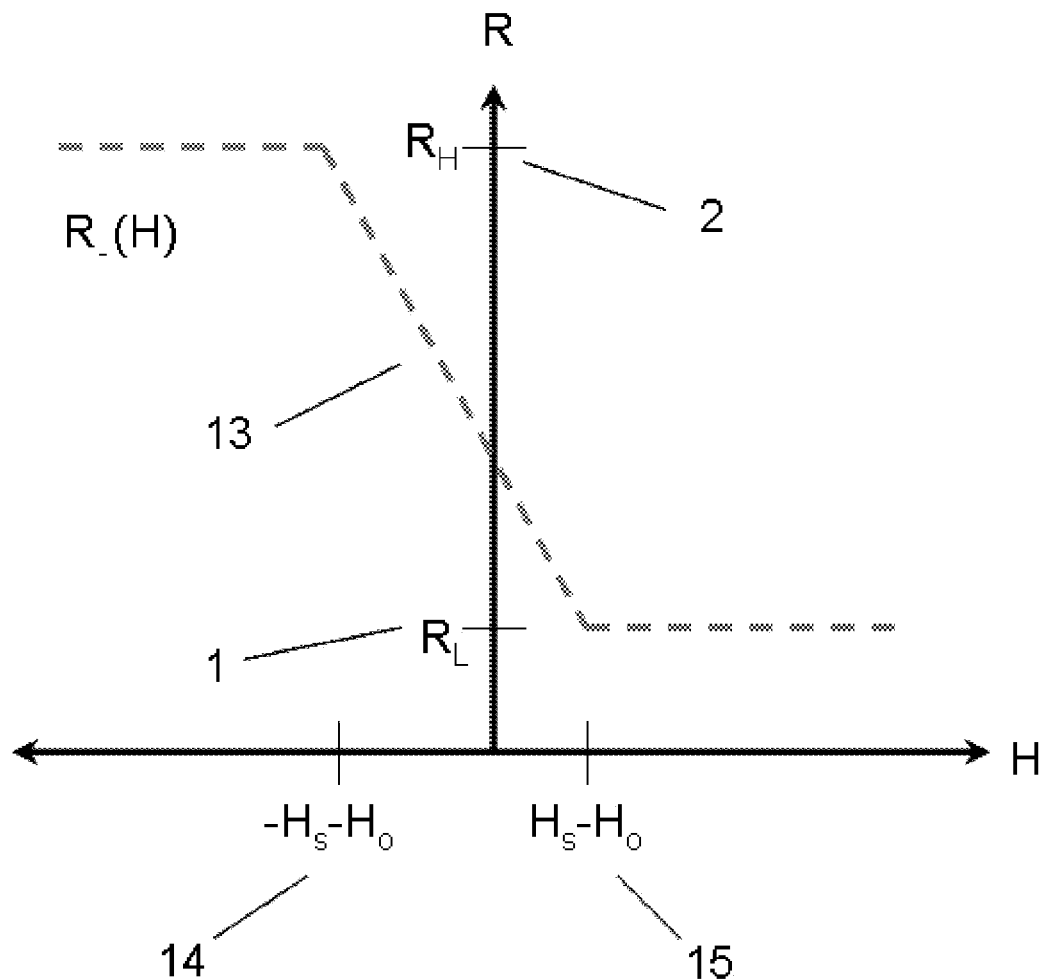
FIG. 2—Schematic drawing of the magnetoresistive response of a spin-valve sensing element with the reference layer magnetization pointing in the positive H direction.

The general form of the magnetoresistive transfer curve of a GMR or MTJ magnetic sensor element suitable for linear magnetic field measurement is shown schematically in FIGS. 1 and 2. The transfer curves depicted in the figures, saturate at low 1 and high 2 resistance values, $R_L$ and $R_H$, respectively. In the region between saturation, the transfer curves are linearly dependent on the applied magnetic field, H. The transfer curves need not be symmetric about the H=0 point in the plots. The saturation fields 4, 5, 14, and 15 are typically offset by an amount $H_o$ such that the $R_L$ saturation region is closer to the H=0 point. The value of $H_o$' which is often referred to as "orange peel" or Neel coupling typically ranges from 1 to 25 Oe. It is a related to roughness of the ferromagnetic films within the GMR and MTJ structures, and it is dependent on materials and manufacturing processes.

The transfer curves in FIGS. 1 and 2 are minor images of each other, and they represent two different orientations of the applied magnetic field with respect to the sensor element. Here +/− designates the direction of the pinned layer magnetization with respect to the measurement directions, the resistance of each sensing arm may be written:

$$R_+(H) = \frac{R_H - R_L}{2H_s}(H - H_o) + \frac{R_H + R_L}{2} \quad (1)$$

$$R_-(H) = \frac{R_L - R_H}{2H_s}(H + H_o) + \frac{R_H + R_L}{2} \quad (2)$$

Figure 3:
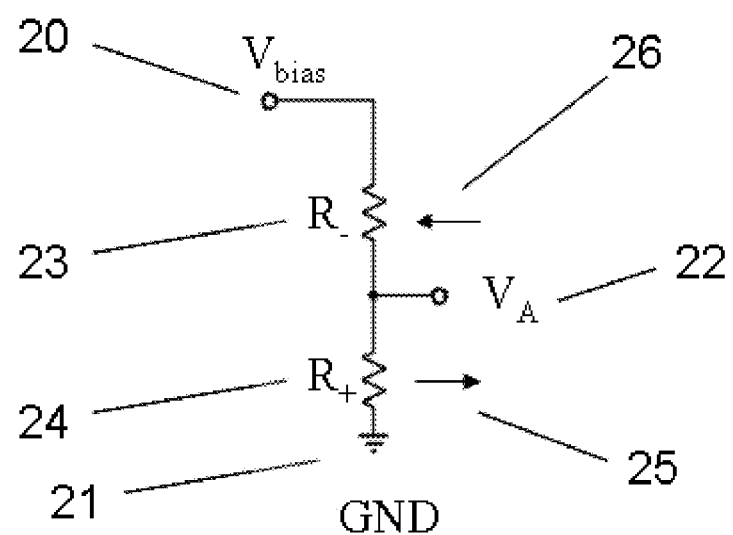
FIG. 3—Schematic drawing of a half-bridge composed of magnetoresistive sensors.

Assuming these magnetoresistive elements 23 and 24 are connected in series in a half-bridge configuration as shown in FIG. 3, and biased using voltage $V_{bias}$ 20, the output of a half bridge composed of the two sensing arms with oppositely oriented pinned layers may be written in one of two different ways, depending on which sensor element 23 or 24 is connected to ground 21 and to $V_{bias}$ 20. For FIG. 3, the half-bridge response may be written as $$V_A(H) = \qquad (3)$$
$$\frac{R_+(H)}{R_+(H) + R_-(H)} V_{bias} = \left( \frac{H(R_H - R_L)}{H_s(R_H + R_L) - H_o(R_H - R_L)} + 1 \right)\left(\frac{V_{bias}}{2}\right)$$

And in the case where $V_{bias}$ and GND are swapped, it may further be written as $$V_B(H) = \qquad (4)$$
$$\frac{R_-(H)}{R_+(H) + R_-(H)} V_{bias} = \left( \frac{-H(R_H - R_L)}{H_s(R_H + R_L) - H_o(R_H - R_L)} + 1 \right)\left(\frac{V_{bias}}{2}\right)$$

Figure 4:
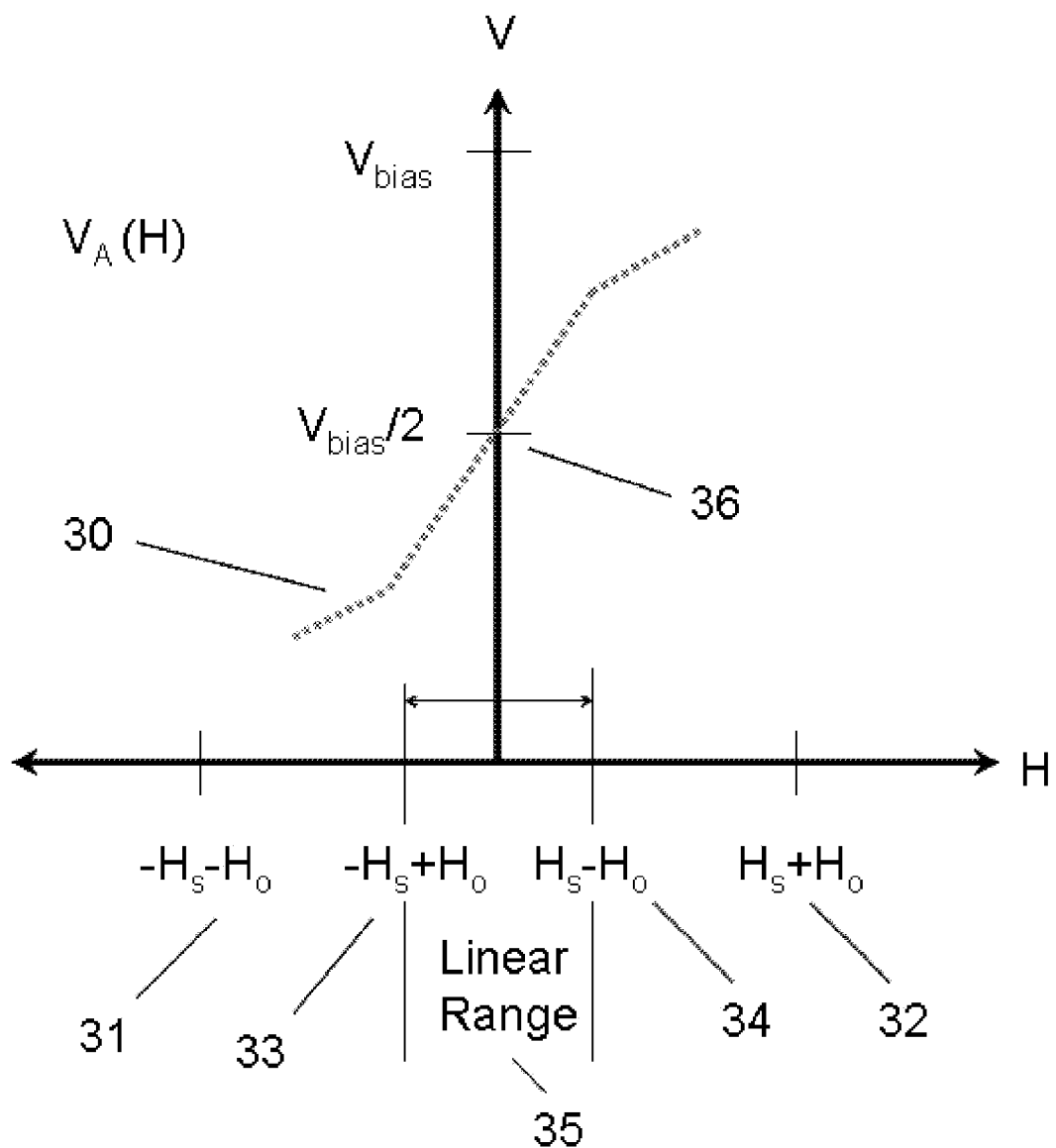
FIG. 4.—Output of a push-pull half-bridge in which $R_+$ is connected to $V_{bias}$ and $R_-$ is connected to ground.
Figure 5:
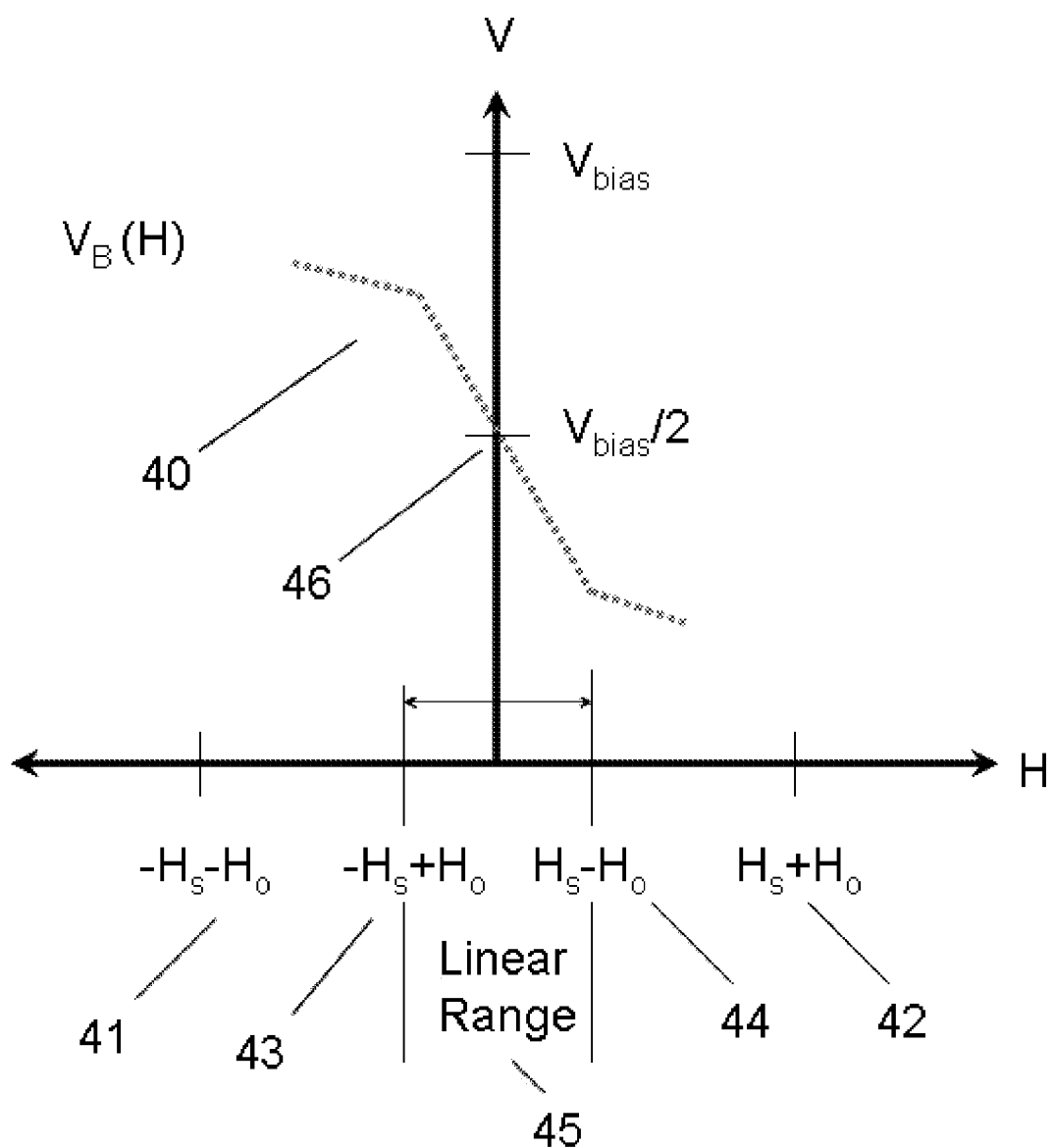
FIG. 5—Output of a push-pull half-bridge in which $R_-$ is connected to $V_{bias}$ and $R_+$ is connected to ground.

The different half-bridge transfer curves 30 and 40 are illustrated in FIGS. 4 and 5. Note there are regions 35 and 45 in which the response of the half-bridge is linear in the applied field, and this linear region is symmetric about the H=0, V=Vbias/2 point 36, 46, in spite of the fact that the individual sensor elements are not symmetric about H=0. Furthermore, note that the extent of the linear region 30, 40 is less than the linear region of each of the individual sensor element transfer curves $R_+$ 3 and $R_-$ 13.

The equations can be expressed in terms of magnetoresistance. Assuming the magnetoresistance is expressed as MR= $(R_H-R_L)/R_L$, then $$V_A(H) = \left( \frac{H}{(H_s - H_o) + (2/MR)H_s} + 1 \right)\left(\frac{V_{bias}}{2}\right) \quad (5)$$

$$V_B(H) = \left( \frac{-H}{(H_s - H_o) + (2/MR)H_s} + 1 \right)\left(\frac{V_{bias}}{2}\right) \quad (6)$$

These equations hold in the linear region 35, 45. Note the response is unipolar in voltage response, offset from zero voltage by an amount $V_{bias}$/2 indicated at points 36, 46. Equations 5 and 6 predict the sensitivity will increase as MR increases, and decrease as $H_s$ increases.

The extent of the linear region in the half bridge is reduced from $2H_s$ to $$H_{Linear} = 2(H_s - H_o) \quad (7)$$

The device will therefore function as a linear sensor provided $H_o$ is less than $H_s$, but the linear field range is reduced. This behavior is common to all push-pull bridges if the offset in the and $R_-$ sensor elements is in the opposite direction.

In order to guarantee the bridge is linear over the desired field range a linear sensor should thus be designed with the $H_s$ of each magnetoresistive elements in the bridge greater than the maximum field that the sensor bridge is intended to measure and given by $$H_s = H_{max} + H_o, \quad (8)$$

Where $H_{max}$ is the maximum field the bridge sensor is intended to measure.

Figure 6:
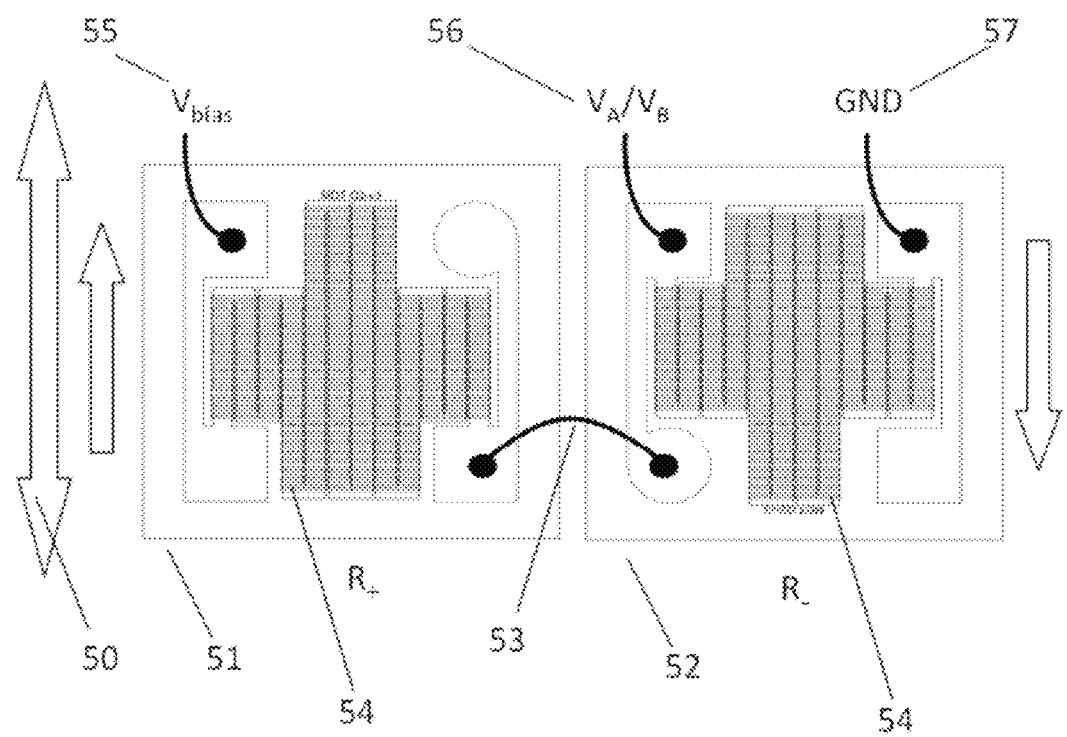
FIG. 6—A drawing showing how two magnetoresistive sensor chips may be oriented with respect to each other and interconnected in order to form a half-bridge sensor.

FIG. 6 shows one possible arrangement and design of magnetoresistive sensor chips for a half-bridge magnetic field sensor that is sensitive to fields along axis 50. Here two sensor chips 51,52 are rotated 180 degrees with respect to each other, such that their reference layers are pointing in opposite directions, as depicted by the arrows in FIG. 6. The half bridge has three terminals 55, 56, 57 used for electrical connections $V_{bias}$, $V_A/V_B$, and GND respectively. The sensor chips may contain arrays or series connected strings 54 of MTJ or GMR elements in order to increase the resistance of the sensor chip. The sensor chips are interconnected using wire bonds 53. The bond pads are designed such that each side of the magnetoresistive elements 54 can have more than one wire bond.

Figure 7:
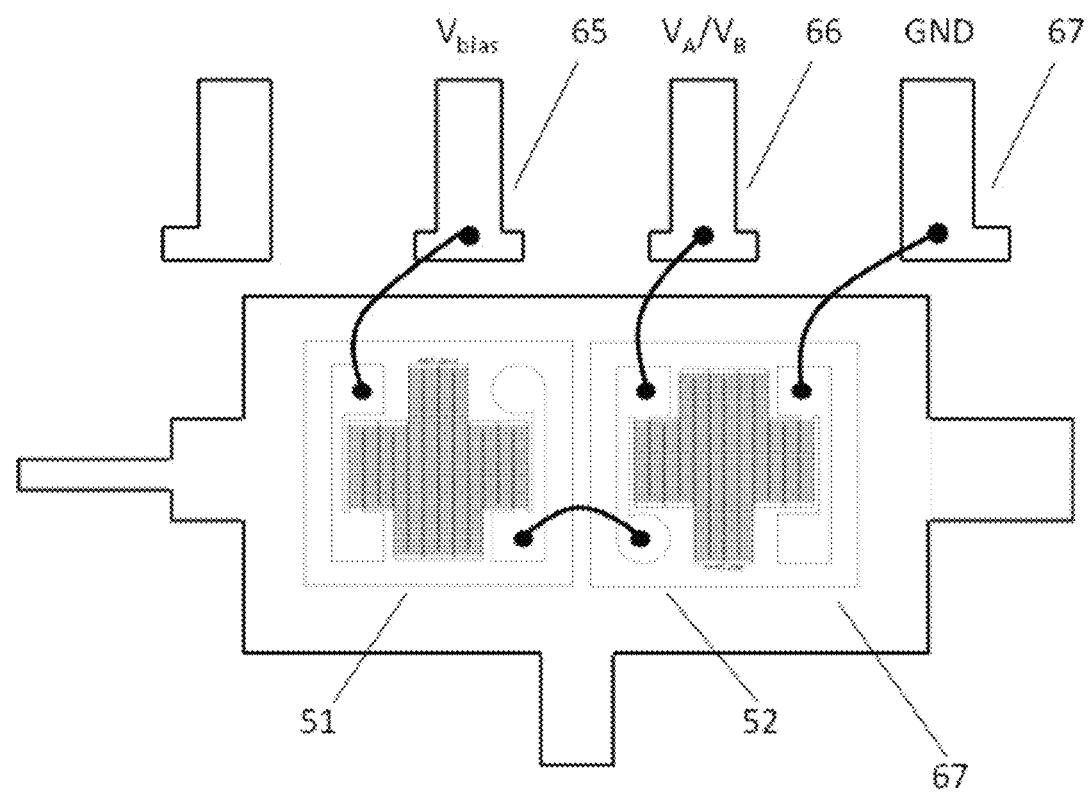
FIG. 7—A drawing showing how two magnetoresistive sensor chips may be placed within a standard semiconductor package in order to form a push-pull half-bridge.
Figure 8:
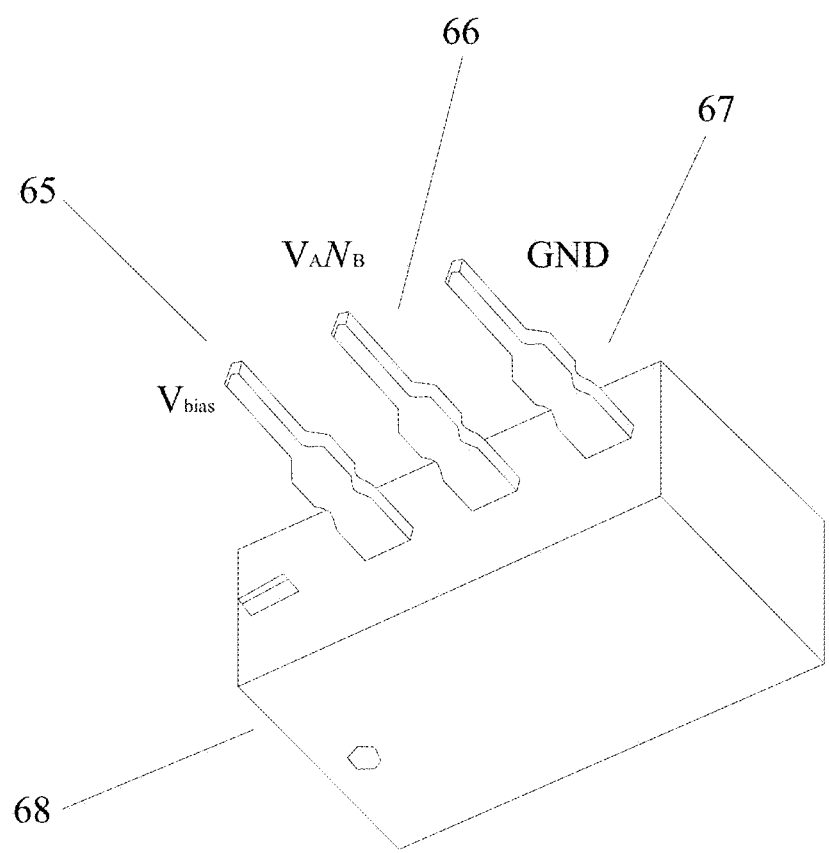
FIG. 8—A drawing of a completed half-bridge sensor in a standard semiconductor package.

FIG. 7 is a schematic illustration of one possible bonding diagram for a standard semiconductor package for the push-pull magnetoresistive sensor. The oppositely oriented sensor chips 51, 52 are adhered to the lead frame paddle 67, and wirebonded to lead frame terminals 65, 66, and 67. The lead frame is then encapsulated in plastic as illustrated in FIG. 8, and lead frame terminals 65, 66, and 67 form the connection pins of the plastic package 68. FIGS. 7 and 8 only represent one of many possible package configurations.

Figure 9:
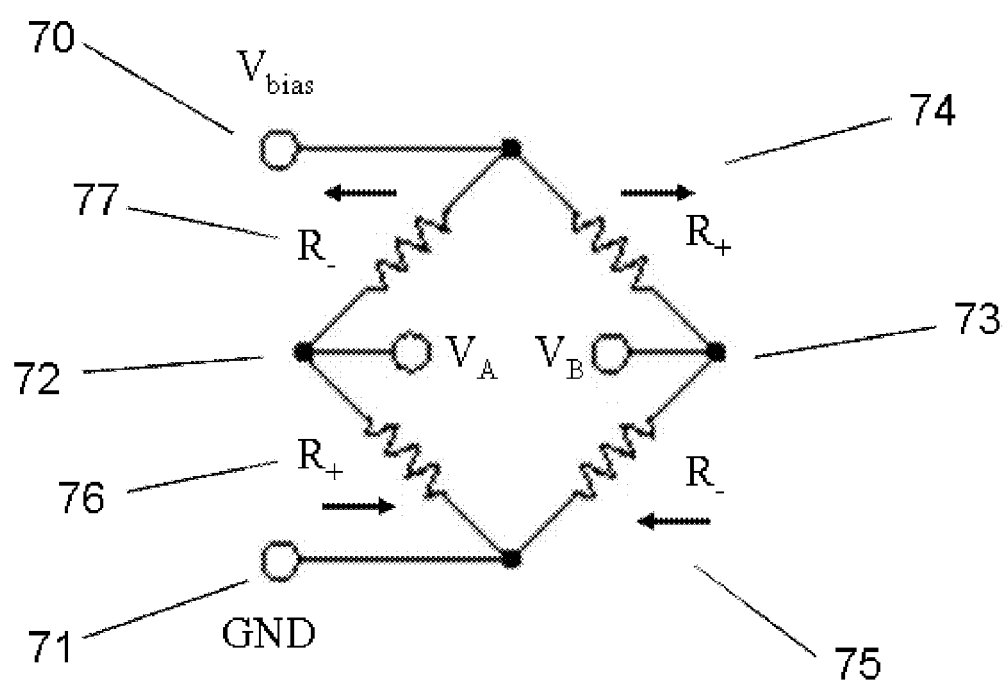
FIG. 9—Schematic drawing of a full-bridge sensor composed of magnetoresistive elements.

A full bridge push-pull sensor is shown schematically in FIG. 9. The sensor is essentially two half bridges, one of type $V_A(H)$ and the other of type $V_B(H)$ connected n parallel between $V_{bias}$ 70 and ground 71. The sensor is thus composed of four magnetoresistive elements, two 75 and 77 of type $R_-$ and two 74 and 76 of type $R_+$.

For the full bridge, the output is given as $$V(H) = V_A(H) - V_B(H) \tag{9}$$

Figure 10:
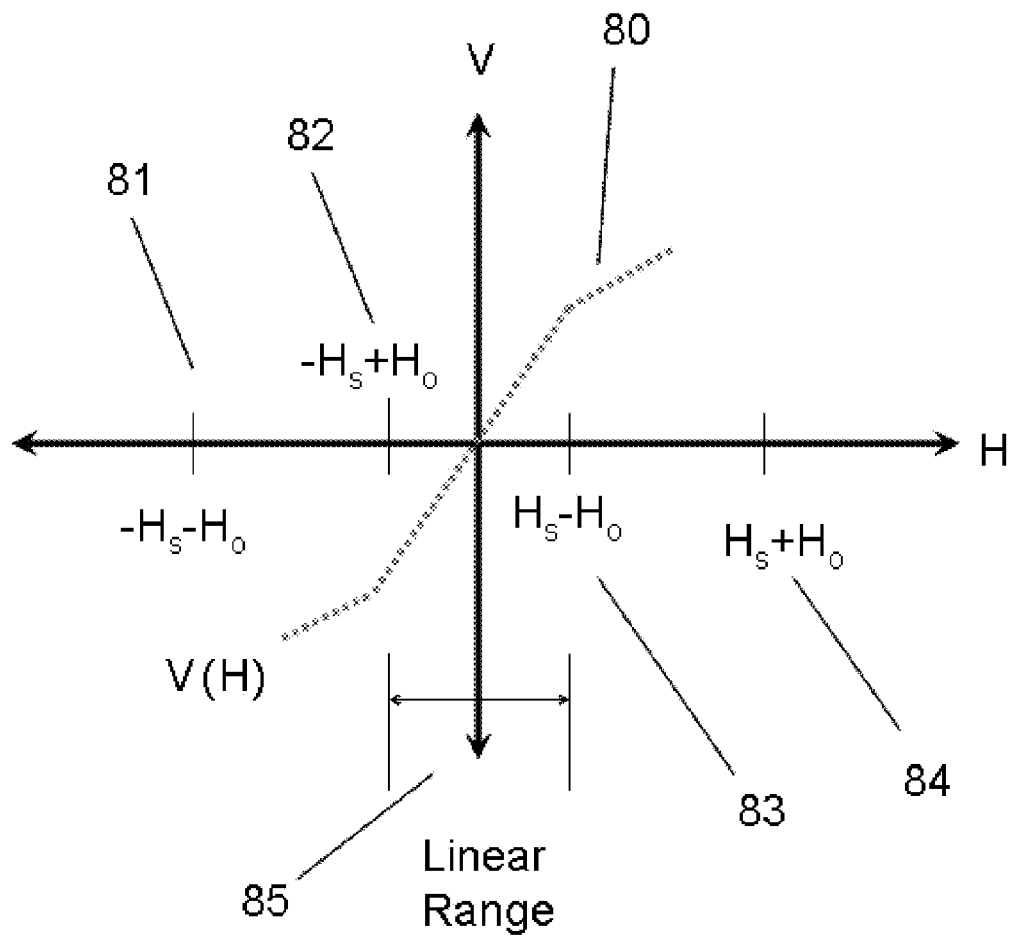
FIG. 10—Field dependence of the output of a push-pull full-bridge magnetoresistive sensor.

This response 80 is plotted in FIG. 10. Over a limited field range around the H=0 between 80 and 82, the output is linear and is related to the magnetic field as follows:

$$V(H) = \frac{(R_H - R_L)V_{bias}}{H_s(R_H + R_L) - H_o(R_H - R_L)} H \tag{10}$$

Unlike the half-bridge response 30 and 40, the full-bridge response V(H) 80 is bipolar in voltage response and the response to magnetic field H is twice as strong. It may be expressed in terms of magnetoresistance as $$V(H) = \frac{V_{bias}}{(H_s - H_o) + (2/MR)H_s} H \tag{11}$$

Like the half-bridge sensors, the full bridge sensitivity increases as MR is increased, and the sensitivity decreases as $H_s$ increases. For MR>>$(H_s+H_o)/(2H_s)$ the response does not increase much. The point of no return is about MR>500%.

Figure 11:
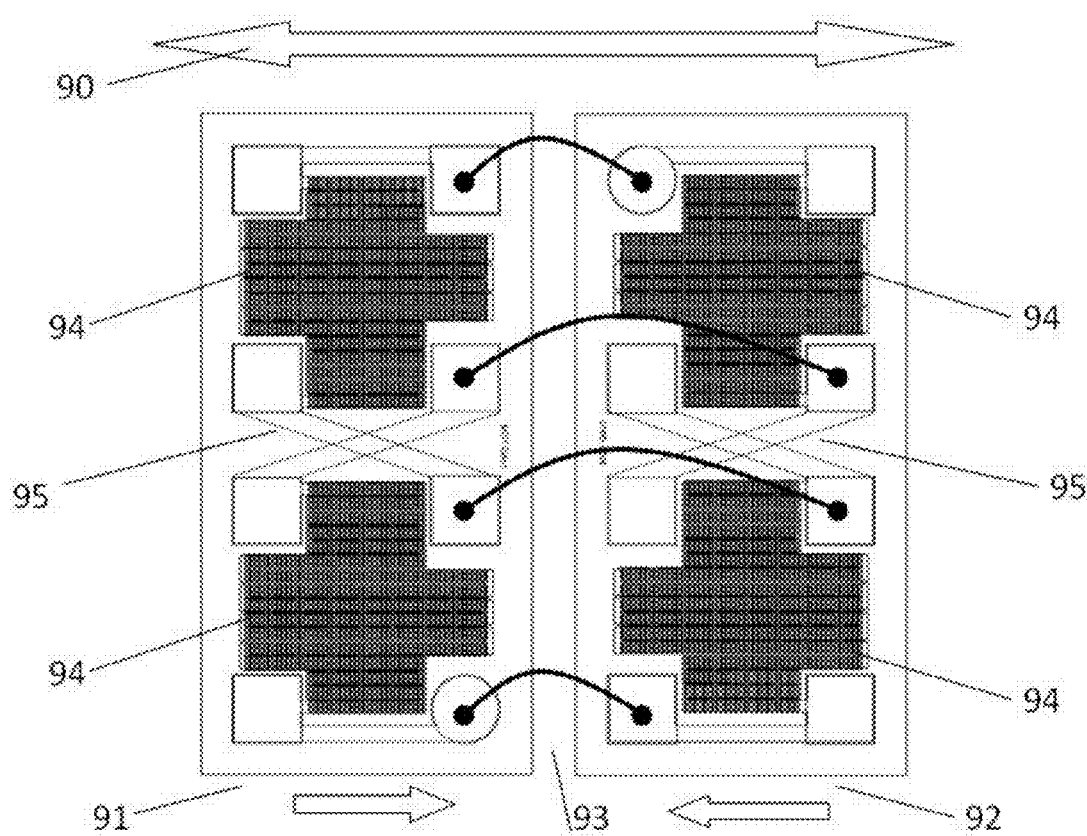
FIG. 11—A schematic drawing showing how two magnetoresistive chips may be located with respect to each other and interconnected in order to form a push-pull full bridge.

FIG. 11 shows two sensor chips 91 and 92 rotated by 180 degrees with respect to each other forming a full-bridge layout. Each sensor chip 94 contains a pair of magnetoresistive composition. Each magnetoresistance element consists of a string of one or more MTJ or GMR sensing units. Said sensor ships have a means for swapping bond pad positions on opposite side of the chip such as the intersection 95. This permits the bond pads on each side of the chip 95 to be exchanged. The purpose is to permit wireboding to external leads 93 to form push-pull full bridge sensor without crossing bond wires. The full-bridge sensors are used to detect the magnetic field along the direction of the reference layer collinear axis 90 direction of the magnetic field.

Figure 12:
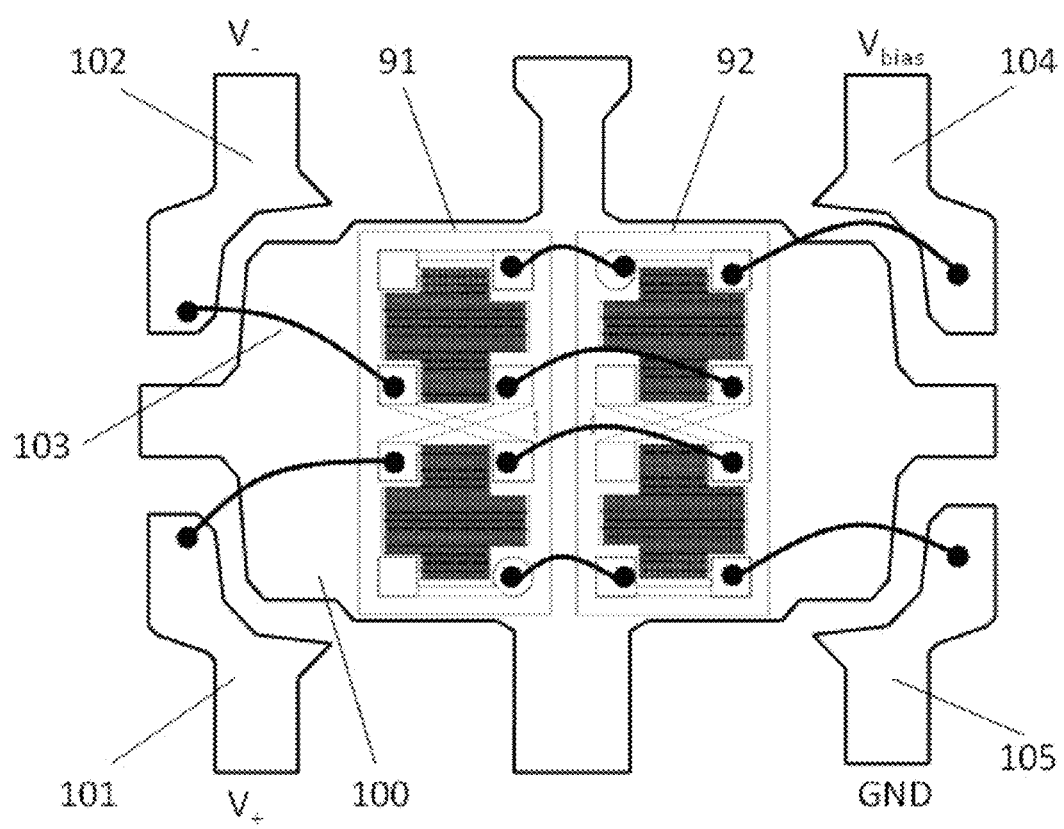
FIG. 12—A drawing showing how two magnetoresistive sensor chips may be placed within a standard semiconductor package in order to form a push-pull full-bridge.

FIG. 12 shows the two sensor chips 91 and 92 fixed to the package lead frame 100 in one possible arrangement. Here, two sensor chips 103 are interconnected using bonding wires to pins $V_A$ 101, $V_B$ 102, $V_{Bias}$ 104 and GND 105.

Figure 13:
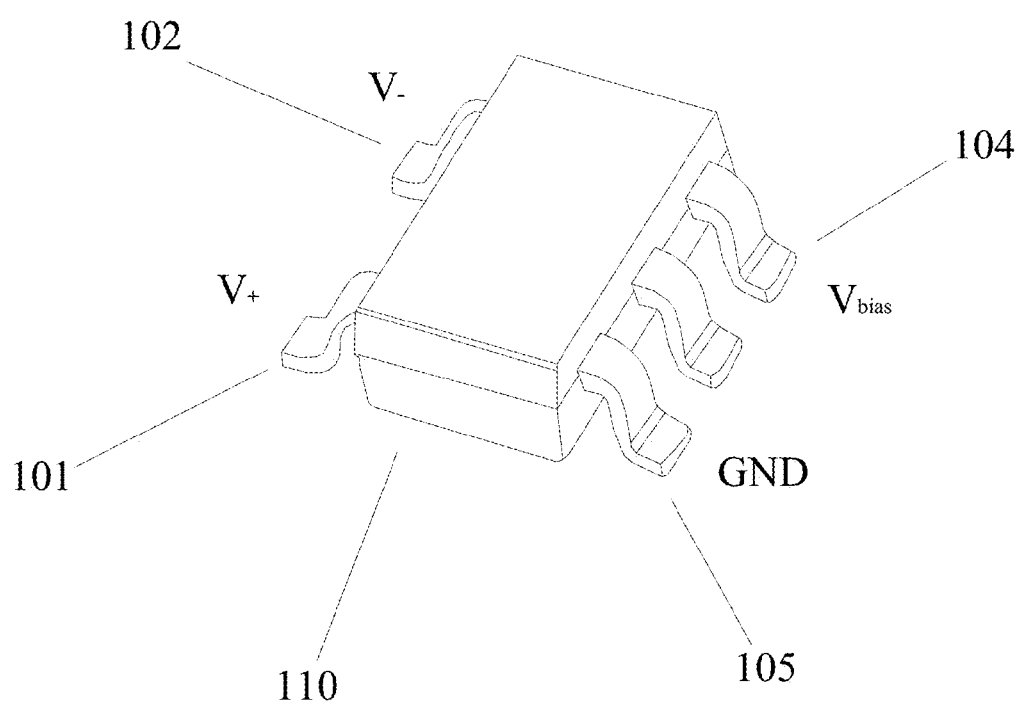
FIG. 13—A drawing of a completed full-bridge sensor in a standard semiconductor package.

FIG. 13 shows the sensor chips and lead frame encapsulated in plastic 103 to form a standard semiconductor package 110. If necessary, the sensor chips can be tested before packaging and sorting in order to substantially match their response and provide better performance. This testing can be accomplished at silicon wafer level test, and using a binning and marking method to classify the chips.

It will be apparent to those skilled in the art that various modifications can be made to the proposed invention without departing from the scope or spirit of the invention. Further, it is intended that the present invention cover modifications and variations of the present invention provided that such modifications and variations come within the scope of the appended claims and their equivalence.

What is claimed is:

1. A single-package push-pull half-bridge magnetic field sensor comprising:
   one or more pairs of MTJ or GMR magnetoresistive sensor chips, wherein one of the MTJ or GMR magnetoresistive sensor chips in each pair is rotated 180 degrees with respect to the other, and the MTJ or GMR magnetoresistive sensor chips are adhered to a semiconductor package lead frame;
   each MTJ or GMR magnetoresistive sensor chip contains one or more MTJ or GMR sensor elements interconnected as a single magnetoresistive element or a plurality of MTJ or GMR magnetoresistive elements, wherein the single element or the plurality of elements is referred to as a bridge arm;
   the MTJ or GMR magnetoresistive elements have a resistance that is linearly proportional to an applied magnetic field over some portion of their magnetoresistive transfer curve;
   each of the MTJ or GMR magnetoresistive sensor chips has substantially the same $R_H$ and $R_L$ values;
   the bond pads of the MTJ or GMR magnetoresistive sensor chip are designed such that more than one wire bond may be attached to each side of the bridge arms; and
   the MTJ or GMR magnetoresistive sensor chips are wire bonded to each other and a semiconductor package lead frame in order to produce a push-pull half-bridge sensor.

2. A single-package push-pull half-bridge magnetic field sensor as in claim 1, where the intrinsic saturation field of each MTJ or GMR magnetoresistive sensor chip's transfer curve minus the offset field of the MTJ or GMR magnetoresistive sensor chip's transfer curve is greater than a desired maximum magnetic field that the push-pull half-bridge sensor is intended to measure.

3. A single-package push-pull half-bridge magnetic field sensor as in claim 2, wherein the MTJ or GMR magnetoresistive sensor chips are tested and sorted before assembly in order to match their transfer curve characteristics.

4. A single-package push-pull half-bridge magnetic field sensor as in claim 3, wherein two push-pull half-bridge sensors are oriented at 90 degrees with respect to each other in order to produce a two-axis magnetic field sensor.

5. A single-package push-pull half-bridge magnetic field sensor as in claim 1, wherein the semiconductor package lead frame and the MTJ or GMR magnetoresistive sensor chips are encapsulated in plastic to form a standard semiconductor package.

6. A single-package push-pull full-bridge magnetic field sensor, comprising:
   one or more pairs of identical MTJ or GMR magnetoresistive sensor chips, wherein one of the MTJ or GMR magnetoresistive sensor chips in each pair is rotated 180 degrees with respect to the other, and the MTJ or GMR magnetoresistive sensor chips are adhered to a semiconductor package lead frame;

each MTJ or GMR magnetoresistive sensor chip is configured as a pair of magnetoresistive elements, with each of the magnetoresistive elements in the pair comprising a string of one or more GMR or MTJ magnetoresistive sensor elements;

wherein the single element or plurality of elements is referred to as a bridge arm;

the MTJ or GMR magnetoresistive elements have a resistance that is linearly proportional to an applied magnetic field over some portion of their magnetoresistive transfer curve;

each of the magnetoresistive sensor chips has substantially the same $R_H$ and $R_L$ values;

the bond pads of each sensor chip are designed such that more than one wire bond may be attached to each side of each bridge arm;

each MTJ or GMR magnetoresistive sensor chip has a crossover in the top and bottom conductors, such that the bond pads on one side of the MTJ or GMR sensor chip can be swapped in position with respect to the magnetoresistive elements, in order to permit wire bonding of the two identical MTJ or GMR magnetoresistive sensor chips in order to form a push-pull full-bridge sensor without crossing the bond wires; and the input and output connections of the MTJ or GMR magnetoresistive sensor chips are wire bonded to the semiconductor package lead frame.

7. A single-package push-pull full-bridge magnetic field sensor as in claim 6, designed such that the intrinsic saturation field of each MTJ or GMR magnetoresistive sensor chip's transfer curve minus the offset field of the MTJ or GMR magnetoresistive sensor chip's transfer curve is greater than a desired maximum magnetic field that the push-pull full-bridge sensor is intended to measure.

8. A single-package push-pull full-bridge magnetic field sensor as in claim 7, wherein the MTJ or GMR magnetoresistive sensor chips are tested and sorted before assembly in order to match their transfer curve characteristics.

9. A single-package push-pull full-bridge magnetic field sensor as in claim 8, wherein the semiconductor package lead frame and the MTJ or GMR magnetoresistive sensor chips are encapsulated in plastic to form a standard semiconductor package.

10. A single-package push-pull full-bridge magnetic field sensor as in claim 6, wherein two push-pull full-bridge sensors are oriented at 90 degrees with respect to each other in order to produce a two-axis magnetic field sensor.

11. A single-package push-pull full-bridge magnetic field sensor as in claim 10, designed such that the intrinsic saturation field of each MTJ or GMR magnetoresistive sensor chip's transfer curve minus the offset magnetic field of the MTJ or GMR magnetoresistive sensor chip's transfer curve is equal to the desired maximum magnetic field the two-axis magnetic field sensor is intended to measure.

12. A single-package push-pull full-bridge magnetic field sensor as in claim 11, wherein the MTJ or GMR magnetoresistive sensor chips are tested and sorted before assembly in order to match their transfer curve characteristics.

13. A single-package push-pull full-bridge magnetic field sensor as in claim 12, wherein the semiconductor package lead frame and MTJ or GMR magnetoresistive sensor chips are encapsulated in plastic to form a standard semiconductor package.

* * * * *